(12) United States Patent
Uemura et al.

(10) Patent No.: US 9,111,951 B2
(45) Date of Patent: Aug. 18, 2015

(54) SEMICONDUCTOR DEVICE

(71) Applicant: SEIKO INSTRUMENTS INC., Chiba (JP)

(72) Inventors: Keisuke Uemura, Chiba (JP); Jun Osanai, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/172,229

(22) Filed: Feb. 4, 2014

(65) Prior Publication Data
US 2014/0217594 A1   Aug. 7, 2014

(30) Foreign Application Priority Data

Feb. 6, 2013  (JP) .................................. 2013-021627

(51) Int. Cl.
*H01L 23/04*   (2006.01)
*H01L 23/00*   (2006.01)
*H01L 23/48*   (2006.01)
*H01L 23/29*   (2006.01)

(52) U.S. Cl.
CPC ............ *H01L 23/564* (2013.01); *H01L 23/481* (2013.01); *H01L 23/293* (2013.01); *H01L 24/05* (2013.01); *H01L 2224/02163* (2013.01); *H01L 2224/02233* (2013.01); *H01L 2224/02255* (2013.01); *H01L 2224/05554* (2013.01); *H01L 2224/05568* (2013.01); *H01L 2224/05573* (2013.01); *H01L 2224/05624* (2013.01); *H01L 2224/05647* (2013.01)

(58) Field of Classification Search
CPC ... H01L 23/293; H01L 23/481; H01L 23/564; H01L 24/05
USPC .................................................... 257/680, 698
See application file for complete search history.

(56) References Cited

U.S. PATENT DOCUMENTS

| 7,129,576 | B2 * | 10/2006 | Humpston ..................... 257/704 |
| 7,224,056 | B2 * | 5/2007 | Burtzlaff et al. ............... 257/704 |
| 7,298,030 | B2 * | 11/2007 | McWilliams et al. ......... 257/680 |

OTHER PUBLICATIONS

Patent Abstracts of Japan, Publication No. 2010-251537, Publication Date Nov. 4, 2010.

* cited by examiner

*Primary Examiner* — Nicholas Tobergte
(74) *Attorney, Agent, or Firm* — Adams & Wilks

(57) ABSTRACT

Provided is a semiconductor device configured to prevent a penetration of moisture into an internal circuit. The moisture from a bonding pad to the internal circuit is blocked by providing an underlying polysilicon film (10) formed as a lower layer of a bonding pad, a bonding pad (1) formed above the underlying polysilicon film (10) through intermediation of an inter-layer insulation film (21), and an outer circumferential interconnecting line (3) formed so as to surround an outer side of the bonding pad 1, and by connecting the outer circumferential interconnecting line (3) and the underlying polysilicon film (10) with a continuous outer circumferential contact.

9 Claims, 6 Drawing Sheets

US 9,111,951 B2

SEMICONDUCTOR DEVICE

BACKGROUND OF THE INVENTION

1. Field of the Invention

The present invention relates to a semiconductor device, in particular, to a semiconductor device having a bonding pad.

2. Description of the Related Art

A semiconductor device must pass various reliability stress tests in order to guarantee the long-term reliability. For example, a test in which a high temperature, a high humidity, and a bias are combined is widely used, such as a high-temperature high-humidity bias test performed under a condition of a temperature of 85° C. and a humidity of 85% and a pressure cooker bias test performed under a condition of a temperature of 125° C., a humidity of 85%, and a pressure of 2 atm. These tests are defined, for example, by the JEDEC standard in view of an actual environment of the market, which are intended to prevent an occurrence of a problem at the market. These tests form a basic guideline for guaranteeing the long-term reliability at the market, which is also needed in order to prevent an occurrence of market defect.

During these high-temperature and high-humidity tests, there may be a case where some moisture having passed through a package resin penetrates into a chip from an opening portion of a pad or the like, and makes an electrochemical reaction to oxidize an interconnecting line, so that a reliability problem occurs due to a volume expansion or an interfacial peeling. In order to prevent such a problem, an invention has been disclosed, which prevents the penetration of the moisture by removing a titanium nitride film formed on a pad in a ring shape or a slit shape in a peripheral portion of a bonding pad (see, for example, Japanese Published Patent Application 2010-251537).

Problems to be solved by the current disclosure are as follows.

As described above, during the high-temperature and high-humidity test, there may be a case where the moisture having passed through a package resin penetrates into a chip from an opening portion of a pad or the like, and makes an electrochemical reaction to oxidize an interconnecting line, so that a reliability problem occurs due to a volume expansion or an interfacial peeling. As a measure against the problem, it can be considered to prevent the penetration of the moisture into the chip by modifying the package resin or by modifying a pad structure. However, in some cases, such a measure is far from being perfect. Although the moisture does not pass through the nitride film and aluminum interconnecting line, the moisture penetrates into the chip through the oxide film, an interface between the oxide film and the aluminum interconnection film, and the like. Some way of blocking these penetration paths is required as the measure against this phenomenon.

SUMMARY OF THE INVENTION

A semiconductor device of the present invention has been made in view of the above-mentioned problem and uses the following measures.

First, there is provided a semiconductor device with a bonding pad including: an oxide film formed on a semiconductor substrate; an electrically-conductive non-water-permeable film formed on the oxide film; a bonding pad formed above the electrically-conductive non-water-permeable film through intermediation of an inter-layer insulation film; a metal interconnecting line configured to connect the bonding pad to an internal circuit; an outer circumferential interconnecting line formed around the bonding pad in a manner of being separated from the bonding pad; and a contact formed along the outer circumferential interconnecting line and, electrically connecting the outer circumferential interconnecting line to the electrically-conductive non-water-permeable film.

Further, in the semiconductor device, the metal interconnecting line and the outer circumferential interconnecting line intersect with each other, the bonding pad is electrically connected to the electrically-conductive non-water-permeable film, and a potential of the bonding pad and a potential of the outer circumferential interconnecting line are equal to each other.

Further, in the semiconductor device, the outer circumferential interconnecting line has a C-shape in plan view, the metal interconnecting line is connected to the internal circuit through an opening of the C-shape, and a potential of the bonding pad and a potential of the outer circumferential interconnecting line differ from each other.

Further, in the semiconductor device, the electrically-conductive non-water-permeable film includes one of a polysilicon film and a metal film.

Further, in the semiconductor device, the contact has the same diameter as a tungsten plug used in the internal circuit and is formed so as to be continuously connected to the tungsten plug.

Further, there is provided a semiconductor device with a bonding pad including: an oxide film formed on a semiconductor substrate; an outer circumferential impurity diffusion layer surrounding the oxide film and formed in a surface of the semiconductor substrate; a bonding pad formed above the oxide film and the outer circumferential impurity diffusion layer through intermediation of an inter-layer insulation film; a metal interconnecting line configured to connect the bonding pad to an internal circuit; an outer circumferential interconnecting line formed around the bonding pad in a manner of being separated from the bonding pad; and a contact formed along the outer circumferential interconnecting line and electrically connecting the outer circumferential interconnecting line to the outer circumferential impurity diffusion layer.

Further, in the semiconductor device, the metal interconnecting line and the outer circumferential interconnecting line intersect with each other, the bonding pad is electrically connected to the outer circumferential impurity diffusion layer, and a potential of the bonding pad and a potential of the outer circumferential interconnecting line are equal to each other.

Further, in the semiconductor device, the outer circumferential interconnecting line has a C-shape in plan view, the metal interconnecting line is connected to the internal circuit through an opening of the C-shape, and a potential of the bonding pad and a potential of the outer circumferential interconnecting line differ from each other.

Further, in the semiconductor device, the contact has the same diameter as a tungsten plug used in the internal circuit and is formed so as to be continuously connected to each other.

The above-mentioned measures enable a block of the penetration of the moisture at the time of performing the reliability test of the semiconductor device, and thus the semiconductor device with high reliability can be achieved.

DETAILED DESCRIPTION OF THE INVENTION

Exemplary embodiments of the present invention are described below with reference to the accompanying drawings.

First Embodiment

Figure 1A:
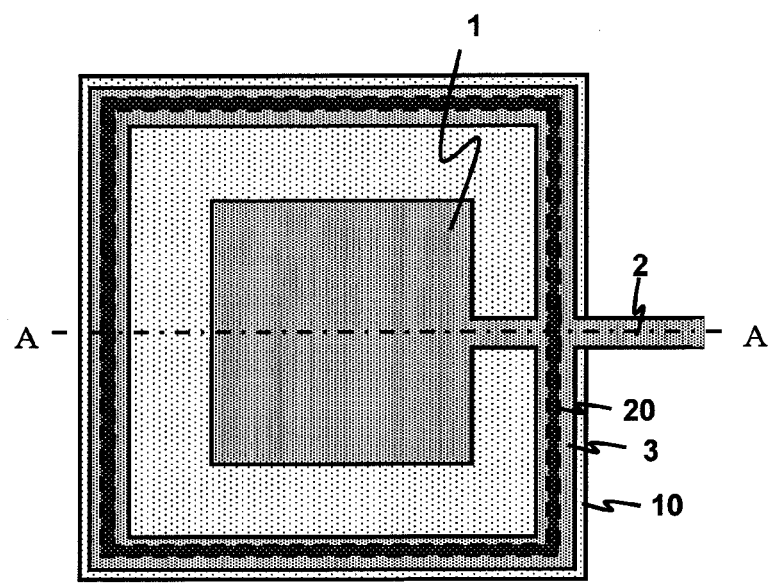
FIGS. 1A and 1B are a plan view and a cross-sectional view, respectively, of a semiconductor device according to a first embodiment of the present invention.

A semiconductor device according to a first embodiment of the present invention is described with reference to FIGS. 1A and 1B. FIG. 1A is a plan view of the semiconductor device according to the first embodiment, and FIG. 1B is a cross-sectional view taken along the line A-A of FIG. 1A.

Figure 1B:
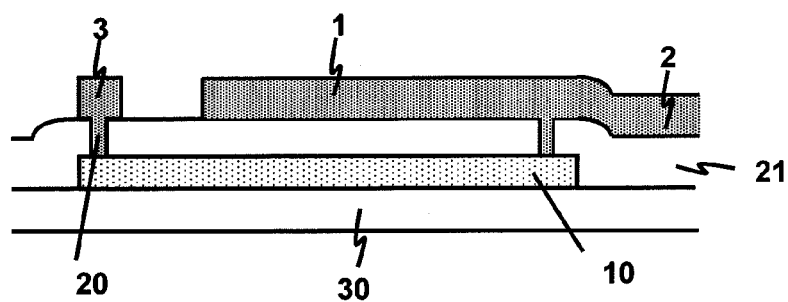

As illustrated in FIGS. 1A and 1B, on an oxide film 30 formed on a semiconductor substrate, an electrically-conductive and non-water-permeable underlying polysilicon film (or polycide film) 10 is formed at a predetermined position. In some embodiments, the oxide film 30 is a LOCOS oxide film, and in some embodiments, the oxide film 30 is a thin oxide film such as a gate oxide film unless the oxide film 30 causes an electrical problem. Above the underlying polysilicon film 10, a bonding pad 1 formed of a metal film smaller than the underlying polysilicon film 10 is arranged through intermediation of an inter-layer insulation film 21 that covers the upper surface and the side surfaces of the underlying polysilicon film 10. As illustrated in the plan view of FIG. 1A, the bonding pad 1 is arranged on the fully inner side of the underlying polysilicon film 10. The bonding pad 1 is connected to a metal interconnecting line 2 formed of a metal film of the same layer, which is extended to be connected to an internal circuit. The metal interconnecting line 2 includes an aluminum interconnecting line, a copper interconnecting line, or the like, and as appropriate, a barrier metal film or an antireflection film is further laminated.

Around the bonding pad 1, an outer circumferential interconnecting line 3 formed of a metal film of the same layer is formed above the underlying polysilicon film 10 in a manner of being separated from the bonding pad 1, and intersects with the metal interconnecting line 2 extended from the bonding pad 1. Therefore, in this case, a potential of the bonding pad 1 and a potential of the outer circumferential interconnecting line 3 are equal to each other. The outer circumferential interconnecting line 3 is electrically connected to the underlying polysilicon film 10 on the downward side via an outer circumferential contact 20 formed along the entire circumference of the outer circumferential interconnecting line 3 immediately below the outer circumferential interconnecting line 3.

The outer circumferential contact 20 can be configured as a part of the outer circumferential interconnecting line 3 embedded into a continuous outer circumferential groove, and can also be configured from tungsten plugs. In the case of using the tungsten plugs, a structure of embedding the tungsten into a continuous groove may not be adopted due to a necessity of unifying a shape of the plug with a small-diameter plug having the same shape as the one used in the internal circuit. In this case, adjacent small-diameter plugs are arranged to share a side surface in which side surfaces brought into contact with each other so that the inter-layer insulation film is divided into an inside portion and an outside portion of the outer circumferential contact 20. Alternatively, tungsten may be embedded into an outer circumferential groove having a width narrower than a diameter of the small-diameter plug. In this structure, with the width narrower than the small-diameter plug, the tungsten is completely filled in the groove. Although it is not shown in the drawings, a part of the bonding pad 1 is opened, and the rest is covered with a silicon nitride film.

With this configuration, the moisture having arrived at proximity of the bonding pad cannot penetrate into an area outside the bonding pad, i.e., the internal circuit, due to the outer circumferential interconnecting line 3, the outer circumferential contact 20, and the underlying polysilicon film 10 that are non-water-permeable, and hence the moisture is blocked with respect to the internal circuit. As a result, a semiconductor device with high reliability can be achieved.

Second Embodiment

Figure 2A:
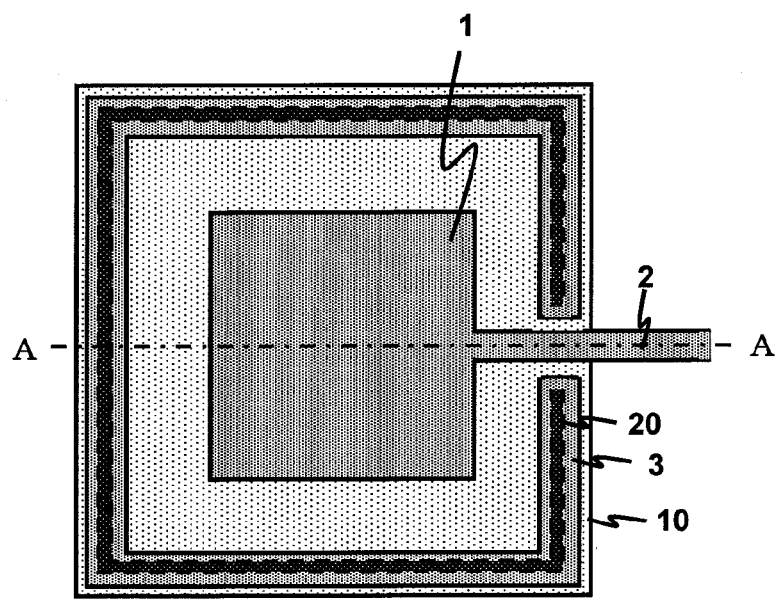
FIGS. 2A and 2B are a plan view and a cross-sectional view, respectively, of a semiconductor device according to a second embodiment of the present invention.
Figure 2B:
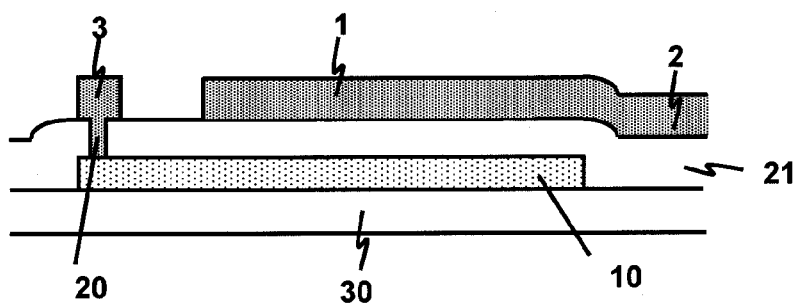

A semiconductor device according to a second embodiment of the present invention is described with reference to FIGS. 2A and 2B. FIG. 2A is a plan view of the semiconductor device according to the second embodiment, and FIG. 2B is a cross-sectional view taken along the line A-A of FIG. 2A.

The second embodiment differs from the first embodiment in that an outer circumferential structure including the outer circumferential interconnecting line 3 and the outer circumferential contact 20 is not electrically connected to the bonding pad.

In the cross-sectional view of the semiconductor device according to the second embodiment, on an oxide film 30 formed on a semiconductor substrate, an electrically-conductive and non-water-permeable underlying polysilicon film (or polycide film) 10 is formed. In some embodiments, the oxide film 30 is a LOCOS oxide film, and in some embodiments, the oxide film 30 is a thin oxide film such as a gate oxide film unless the oxide film 30 causes an electrical problem. A bonding pad 1 formed of a metal film is arranged through intermediation of an inter-layer insulation film 21 that covers the upper surface and the side surfaces of the underlying polysilicon film 10. The bonding pad 1 is connected to a metal interconnecting line 2 formed of a metal film of the same layer, which is connected to an internal circuit. The metal interconnecting line 2 includes an aluminum interconnecting line, a copper interconnecting line, or the like, and as appropriate, a barrier metal film or an antireflection film is further laminated. Around the bonding pad 1, an outer circumferential interconnecting line 3 of an angled C-shape formed of a metal film of the same layer is formed in a manner of being separated from the bonding pad 1. The metal interconnecting line 2 extended from the bonding pad 1 is separated from the outer circumferential interconnecting line 3, passes through the opening of the C-shape of the outer circumferential interconnecting line 3, and is connected to the internal circuit. In this case, the potential of the bonding pad 1 and the potential of the outer circumferential interconnecting line 3 can be set differently from each other so that the outer circumferential interconnecting line 3 can be set to a power supply potential or a ground potential. In some cases, the outer circumferential interconnecting line 3 can be electrically floated or can be fixed to a certain potential.

The outer circumferential interconnecting line 3 is electrically connected to the underlying polysilicon film 10 on the downward side via an outer circumferential contact 20 formed immediately below the outer circumferential interconnecting line 3. In some embodiments, the outer circumferential contact 20 is configured as a part of the outer circumferential interconnecting line 3 embedded into a continuous outer circumferential groove, and in some embodiments, the outer circumferential contact 20 is configured as a tungsten plug. In the case of using the tungsten plug, a structure of embedding the tungsten into a continuous groove may not be adopted due to a necessity of unifying a shape of the plug with a small-diameter plug having the same shape as the one used in the internal circuit. In this case, adjacent small-diameter plugs are arranged with side surfaces brought into contact with each other so that the inter-layer insulation film is divided into an inside portion and an outside portion of the outer circumferential contact 20. Alternatively, tungsten may be embedded into an outer circumferential groove having a width narrower than a diameter of the small-diameter plug. In this structure, with the width narrower than the small-diameter plug, the tungsten is completely filled in the groove. Although it is not shown in the drawings, the bonding pad 1 is covered with a silicon nitride film such that a part of the bonding pad 1 is opened.

With this configuration, because a part of the outer circumferential interconnecting line 3 is cut, although it is a little weaker than the first embodiment, the moisture having arrived at proximity of the bonding pad is prevented from penetrating into an area outside the bonding pad, i.e., the internal circuit, due to the outer circumferential interconnecting line 3, the outer circumferential contact 20, and the underlying polysilicon film 10 that are non-water-permeable, and hence the moisture is blocked with respect to the internal circuit. As a result, a semiconductor device with high reliability can be achieved.

Third Embodiment

Figure 3A:
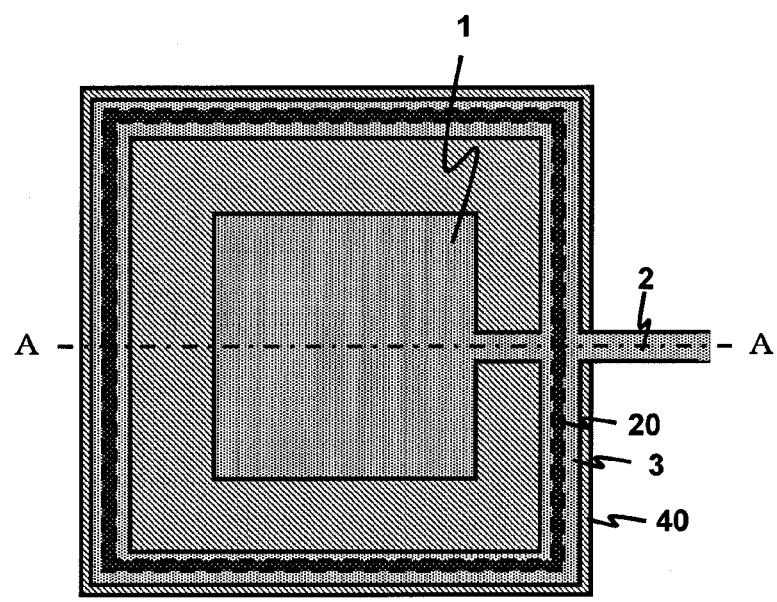
FIGS. 3A and 3B are a plan view and a cross-sectional view, respectively, of a semiconductor device according to a third embodiment of the present invention.
Figure 3B:
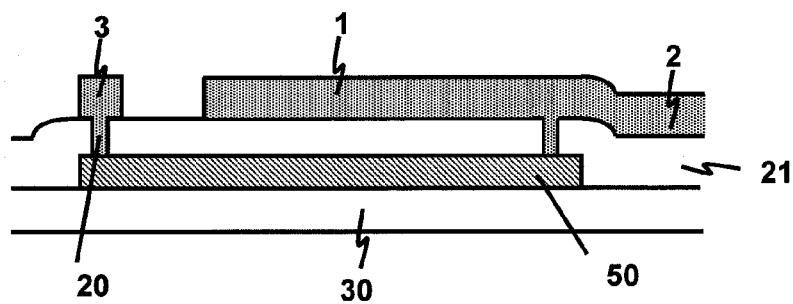

A semiconductor device according to a third embodiment of the present invention is described with reference to FIGS. 3A and 3B. FIG. 3A is a plan view of the semiconductor device according to the third embodiment, and FIG. 3B is a cross-sectional view taken along the line A-A of FIG. 3A.

The third embodiment differs from the first embodiment in that an electrically-conductive non-water-permeable underlying metal film 50 is employed instead of the underlying polysilicon film 10. By employing a metal film, the block of the moisture is stronger, thereby achieving a structure with higher reliability than the structure of the first embodiment, and hence the structure according to the third embodiment is adopted in a semiconductor device having a multilayer interconnection structure.

Fourth Embodiment

Figure 4A:
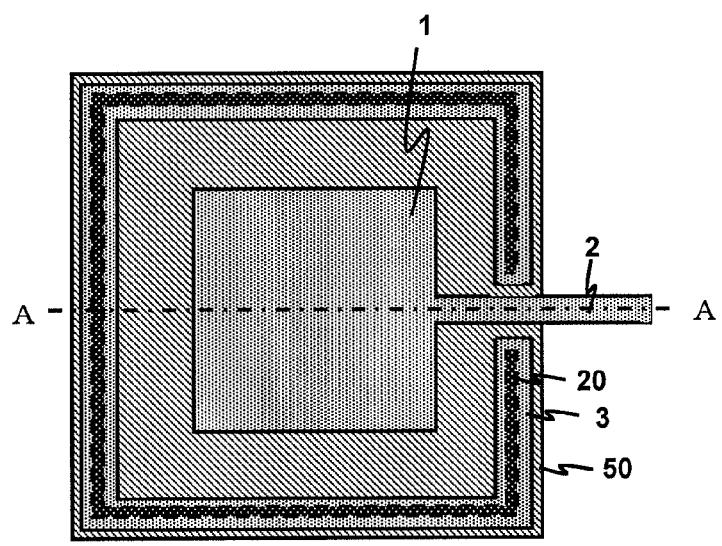
FIGS. 4A and 4B are a plan view and a cross-sectional view, respectively, of a semiconductor device according to a fourth embodiment of the present invention.
Figure 4B:
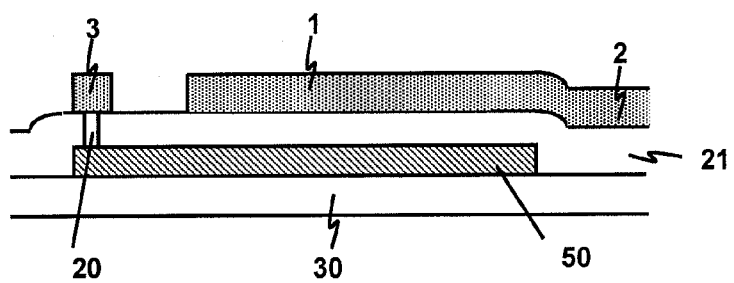

A semiconductor device according to a fourth embodiment of the present invention is described with reference to FIGS. 4A and 4B. FIG. 4A is a plan view of the semiconductor device according to the fourth embodiment, and FIG. 4B is a cross-sectional view taken along the line A-A of FIG. 4A.

The fourth embodiment differs from the second embodiment in that an electrically-conductive non-water-permeable underlying metal film 50 is employed instead of the underlying polysilicon film 10. By employing a metal film, the block of the moisture is stronger, thereby achieving a structure with higher reliability than the structure of the second embodiment, and hence the structure according to the fourth embodiment is adopted in a semiconductor device having a multilayer interconnection structure. Further, in the semiconductor device according to the fourth embodiment, the potential of the outer circumferential interconnecting line can be arbitrarily changed.

Fifth Embodiment

Figure 5A:
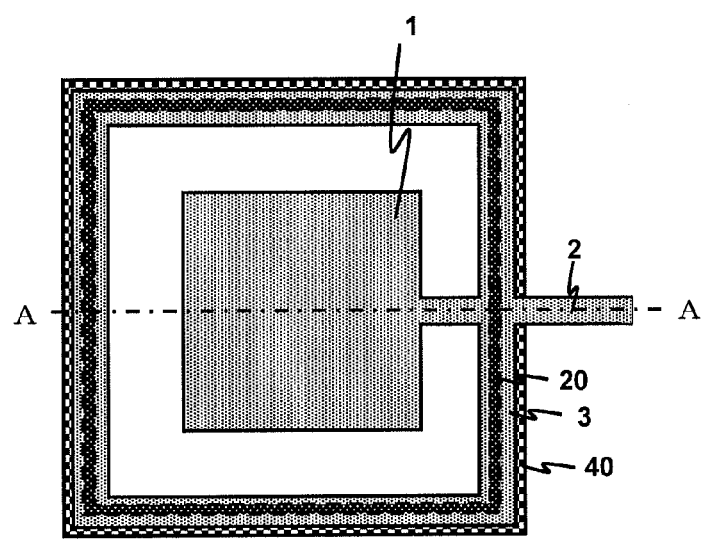
FIGS. 5A and 5B are a plan view and a cross-sectional view, respectively, of a semiconductor device according to a fifth embodiment of the present invention.
Figure 5B:
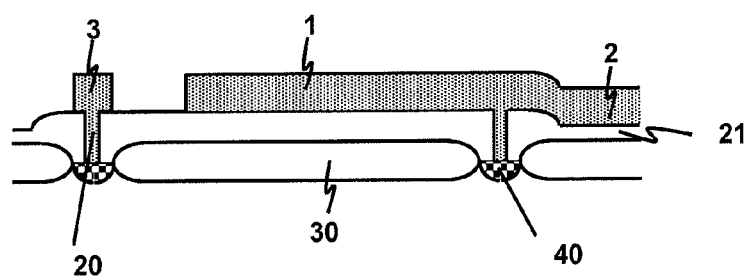

A semiconductor device according to a fifth embodiment of the present invention is described with reference to FIGS. 5A and 5B. FIG. 5A is a plan view of the semiconductor device according to the fifth embodiment, and FIG. 5B is a cross-sectional view taken along the line A-A of FIG. 5A.

The fifth embodiment differs from the first embodiment in that an outer circumferential impurity diffusion layer 40 is formed in a semiconductor substrate and a LOCOS oxide film 30 is arranged inside the outer circumferential impurity diffusion layer 40, instead of the underlying polysilicon film 10. An outer circumferential contact 20 connects the outer circumferential impurity diffusion layer 40 to an outer circumferential interconnecting line 3, and the outer circumferential contact 20 divides an inter-layer insulation film 21 into an inside portion and an outside portion of the outer circumferential contact 20. A bonding pad 1 is electrically connected to the outer circumferential impurity diffusion layer 40 via the outer circumferential interconnecting line 3. By setting the conductivity type of the outer circumferential impurity diffusion layer 40 different from the conductivity type of a surrounding well or the semiconductor substrate, the bonding pad is connected to a power supply level (VDD) or a ground level (VSS) via a diode that is connected in a reverse direction. When the conductivity type of the outer circumferential impurity diffusion layer 40 is set to the same conductivity type as that of the surrounding well or the semiconductor substrate, the potential of the bonding pad can be fixed to the power supply level (VDD) or the ground level (VSS). This structure can be applied to a bonding pad having the same potential as that of the substrate or the well.

Sixth Embodiment

Figure 6A:
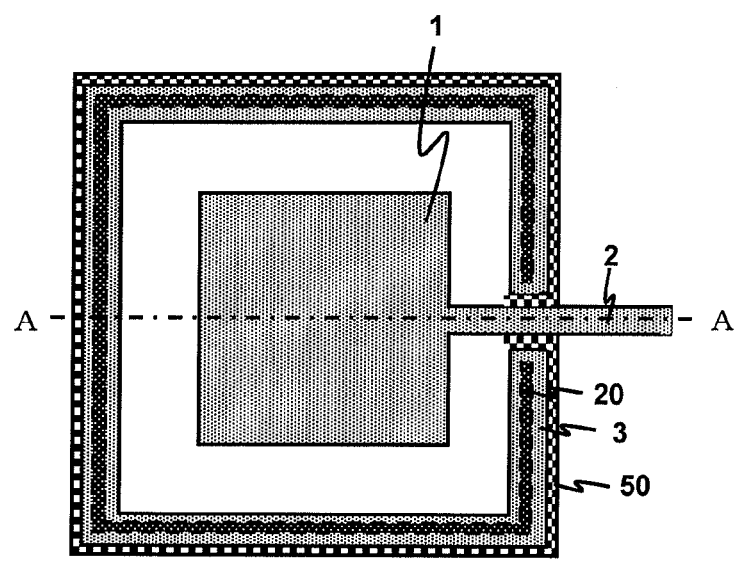
FIGS. 6A and 6B are a plan view and a cross-sectional view, respectively, of a semiconductor device according to a sixth embodiment of the present invention.
Figure 6B:
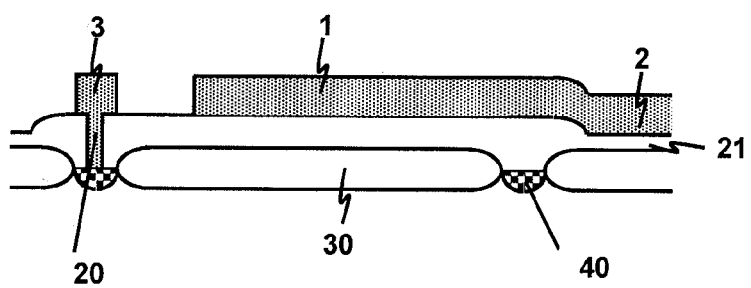

A semiconductor device according to a sixth embodiment of the present invention is described with reference to FIGS. 6A and 6B. FIG. 6A is a plan view of the semiconductor device according to the sixth embodiment, and FIG. 6B is a cross-sectional view taken along the line A-A of FIG. 6A.

The sixth embodiment differs from the second embodiment in that an outer circumferential impurity diffusion layer 40 is formed in a semiconductor substrate and a LOCOS oxide film 30 is arranged inside the outer circumferential impurity diffusion layer 40, instead of the underlying polysilicon film 10. An outer circumferential contact 20 connects the outer circumferential impurity diffusion layer 40 to an outer circumferential interconnecting line 3. Although the outer circumferential interconnecting line 3 is connected to the impurity diffusion layer, unlike the fifth embodiment, the bonding pad is not directly interconnecting lined to the substrate diffusion layer, and hence an arbitrary potential can be applied or output to the bonding pad 1. As a matter of course, the potential of the outer circumferential interconnecting line 3 is restricted to be the same potential as that of the substrate or the well or to be connected to the potential of the substrate or the well via a diode that is connected in the reverse direction.

What is claimed is:

1. A semiconductor device, comprising:
    a semiconductor substrate;
    an oxide film formed on the semiconductor substrate;
    an electrically-conductive non-water-permeable film formed on the oxide film;
    a bonding pad formed above the electrically-conductive non-water-permeable film through intermediation of an inter-layer insulation film, the bonding pad being smaller than the electrically-conductive non-water-permeable film;
    a metal interconnecting line configured to connect the bonding pad to an internal circuit;
    an outer circumferential interconnecting line surrounding the bonding pad and formed above the electrically-conductive non-water-permeable film, the being separated from the bonding pad; and
    a contact formed along an entire circumference of the outer circumferential interconnecting line, the contact electrically connecting the outer circumferential interconnecting line to the electrically-conductive non-water-permeable film and dividing the inter-layer insulation film into an inside portion and an outside portion of the contact.

2. A semiconductor device according to claim 1, wherein
    the metal interconnecting line and the outer circumferential interconnecting line intersect with each other;
    the bonding pad is electrically connected to the electrically-conductive non-water-permeable film; and
    a potential of the bonding pad and a potential of the outer circumferential interconnecting line are equal to each other.

3. A semiconductor device according to claim 1, wherein:
    the outer circumferential interconnecting line has a C-shape in a plan view;
    the metal interconnecting line is connected to the internal circuit through an opening of the C-shape; and
    a potential of the bonding pad and a potential of the outer circumferential interconnecting line differ from each other.

4. A semiconductor device according to claim 1, wherein the electrically-conductive non-water-permeable film comprises one of a polysilicon film and a metal film.

5. A semiconductor device according to claim 1, wherein the contact has a same diameter as that of a tungsten plug used in the internal circuit and is formed continuously to share a side surface.

6. A semiconductor device, comprising:
    a semiconductor substrate;
    an oxide film formed on the semiconductor substrate;
    an outer circumferential impurity diffusion layer surrounding the oxide film and formed in a surface of the semiconductor substrate;
    a bonding pad formed above the oxide film through intermediation of an inter-layer insulation film, the bonding pad being smaller than the oxide film;
    a metal interconnecting line configured to connect the bonding pad to an internal circuit;
    an outer circumferential interconnecting line surrounding the bonding pad and formed above the outer circumferential impurity diffusion layer in a manner of being separated from the bonding pad; and
    a contact formed along an entire circumference of the outer circumferential interconnecting line, the contact electrically connecting the outer circumferential interconnecting line to the outer circumferential impurity diffusion layer and dividing the inter-layer insulation film into an inside portion and an outside portion of the contact.

7. A semiconductor device according to claim 6, wherein
    the metal interconnecting line and the outer circumferential interconnecting line intersect with each other;
    the bonding pad is electrically connected to the outer circumferential impurity diffusion layer; and
    a potential of the bonding pad and a potential of the outer circumferential interconnecting line are equal to each other.

8. A semiconductor device according to claim 6, wherein:
    the outer circumferential interconnecting line has a C-shape in a plan view;
    the metal interconnecting line is connected to the internal circuit through an opening of the C-shape; and
    a potential of the bonding pad and a potential of the outer circumferential interconnecting line differ from each other.

9. A semiconductor device according to claim 6, wherein the contact has the same diameter as a tungsten plug used in the internal circuit and is formed so as to be continuously connected to the tungsten plug.

* * * * *